United States Patent [19]
Rahman et al.

[11] Patent Number: 5,286,606
[45] Date of Patent: Feb. 15, 1994

[54] PROCESS FOR PRODUCING A DEVELOPER HAVING A LOW METAL ION LEVEL

[75] Inventors: M. Dalil Rahman, Warwick; Dana L. Durham, East Greenwich, both of R.I.

[73] Assignee: Hoechst Celanese Corporation, Somerville, N.J.

[21] Appl. No.: 996,925

[22] Filed: Dec. 29, 1992

[51] Int. Cl.$^5$ .............................................. G03C 5/305
[52] U.S. Cl. .................................. 430/311; 430/314; 430/323; 430/327; 430/331
[58] Field of Search ............... 430/311, 314, 323, 327, 430/331

[56] References Cited

U.S. PATENT DOCUMENTS

| | | | |
|---|---|---|---|
| 4,784,937 | 11/1988 | Tanaka et al. | 430/331 |
| 4,833,067 | 5/1989 | Tanaka et al. | 430/323 |
| 4,914,006 | 4/1990 | Kato et al. | 430/331 |
| 5,175,078 | 12/1992 | Aoyama et al. | 430/331 |

FOREIGN PATENT DOCUMENTS 1-072155  3/1989  Japan ................................. 430/331

OTHER PUBLICATIONS

U.S. Ser. No. 07/809591, Dec. 1991, Rahman et al.
U.S. Ser. No. 07/904229, Jun. 1992, Rahman et al.
U.S. Ser. No. 07/984655, Dec. 1992, Rahman et al.
U.S. Ser. No. 07/982197, Nov. 1992, Rahman.
U.S. Ser. No. 07/999500, Dec. 1992, Rahman et al.
U.S. Ser. No. 07/996917, Dec. 1992, Rahman et al.

*Primary Examiner*—Hoa Van Le
*Attorney, Agent, or Firm*—Andrew F. Sayko, Jr.

[57] ABSTRACT

The present invention provides a process for producing a developer containing a surfactant which contains a very low level of metal ions and a process for developing light sensitive photoresist compositions, using such a developer, to produce semiconductor devices.

9 Claims, No Drawings

PROCESS FOR PRODUCING A DEVELOPER HAVING A LOW METAL ION LEVEL

BACKGROUND OF THE INVENTION

The present invention relates to a process for producing a developer containing a surfactant, which contain a very low level of metal ions, especially sodium and iron. The invention also provides a process for developing light-sensitive photoresist compositions, using such a developer, to produce semiconductor devices. Further, the present invention relates to a process for the use of surfactant in a developer, such as an aqueous tetramethyl ammonium hydroxide based developer for photoresists, as well as the process of coating, imaging and developing light-sensitive photoresist compositions coated on such substrates, to produce semiconductor devices, such as computer memory chips.

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an imagewise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist and all of the anti-reflective coating from the surface of the substrate.

Metal contamination has been a problem for a long time in the fabrication of high density integrated circuits and computer chips, often leading to increased defects, yield losses, degradation and decreased performance. In plasma processes, metals such as sodium and iron, when they are present in the photoresist or in a coating on the photoresist, can cause contamination especially during plasma stripping. However, these problems have been overcome to a substantial extent during the fabrication process, for example, by utilizing Hcl gathering of the contaminants during a high temperature anneal cycle.

As semiconductor devices have become more sophisticated, these problems have become much more difficult to overcome. When silicon wafers are coated with a liquid positive photoresist and subsequently stripped off, such as with oxygen microwave plasma, the performance and stability of the semiconductor device is often seen to decrease. As the plasma stripping process is repeated, more degradation of the device frequently occurs. The cause of such problems can be the metal contamination in the (i) photoresist, (ii) antireflective coating on the wafer, and (iii) developer. Metal levels of less than 1.0 ppm can adversely affect the properties of such semiconductor devices. surfactants are used as coating additives in photoresists, as well as additives in developer solutions. Various kinds of surfactants are applied to formulate the developer by mixing with a developer such as an aqueous tetramethyl ammonium hydroxide solution.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating. Thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble in the developer solution (e.g. a rearrangement reaction occurs) while those areas not exposed remain relatively insoluble in the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the now partially unprotected substrate may be treated with a substrate-etchant solution or plasma gases and the like. The etchant solution or plasma gases etch that portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less then one micron are necessary. In addition, it is almost always desirable that the developed photoresist wall profiles be near vertical relative to the substrate. such demarcations between developed and undeveloped areas of the resist coating translate into accurate pattern transfer of the mask image onto the substrate.

SUMMARY OF THE INVENTION

The present invention relates to a process for producing a surfactant containing very low levels of metal ions, especially sodium and iron and for producing a developer containing such a surfactant. The invention further relates to a process for producing semiconductor devices using such a developer for photoresists.

The process of the subject invention provides a developer containing such a surfactant and having a very low level of metal ions. The developer is applied to wash out the undesired area of a photoresist coating on the wafer which may be either negative or positive working, although positive photoresists are preferred.

The surfactant obtained has a very low levels of metal ions such as iron, sodium, potassium, calcium, magnesium, copper and zinc. Sodium and iron are the most common metal ion contaminants and among the easiest to detect. The level of these metal ions serves as an indicator of the level of other metal ions. The level of sodium and iron ions, are each respectively, less than 200 ppb, preferably less than 100 ppb, more preferably less than 50 ppb, even more preferably less than 20 ppb and most preferably less than 10 ppb.

DETAILED DESCRIPTION OF THE PREFERRED EMBODIMENT

The present invention provides a process for producing a developer having a very low level of metal ions, particularly sodium and iron. In the preferred embodiment, the process utilizes an acidic ion exchange resin to purify the developer. The subject process comprises:
a) treating an acidic ion exchange resin with water, preferably deionized water, followed by a mineral acid solution (e.g. a 5-98% solution of sulfuric, nitric or hydrochloric acid) to reduce the level of total sodium and iron ions in the ion exchange resin to less than 500 ppb, preferably less than 200 ppb, more preferably less than 100 ppb and most preferably no more than 40 ppb;
b) providing a solution of 1 to 40 weight percent of a surfactant in a deionized solvent, such as deionized water;
c) passing the surfactant solution through the ion exchange resin and reducing the level of total sodium and iron ions in the solution Lo less than 200 ppb each, preferably less than 100 ppb, more preferably less than 50 ppb, even more preferably less than 20 ppb and most preferably less than 10 ppb;
d) formulating a developer composition by providing an admixture of:
  (1) the ion exchange resin treated surfactant solution in a suitable deionized solvent (adjust the concentration by adding more of the same solvent, such as deionized water and/or ethanol);
  (2) mixing the surfactant solution with a suitable metal ion free developer, such as an ammonium hydroxyide, preferably tetramethyl ammonium hydroxide (TMAH).

Prior to the ion exchange resin treating of the surfactant solution component, the ion exchange resin is treated with a solvent which is the same as, or at least compatible with, the solvent for the component or mixture of components which is to be treated with the ion exchange resin. Preferably, the ion exchange resin is treated with sufficient new solvent to substantially remove other solvents and to saturate the ion exchange resin with the new solvent.

An acidic ion exchange resin, such as a styrene/divinylbenzene cation exchange resin, is utilized in the present process. Such ion exchange resins are available from Rohm and Haas company, e.g. AMBERLYST 15 resin and Bio Rad, e.g. Analytical Grade 50W-X12, 50W-X8 or 50W-X4. These resins typically contain as much as 80,000 to 200,000 ppb of sodium and iron. Before being utilized in the process of the present invention, the ion exchange resin must be treated with water and then a mineral acid solution to reduce the metal ion level. Preferably the ion exchange resin is initially rinsed with deionized water, followed by a mineral acid solution, such as 10 percent sulfuric acid solution, rinsed again with deionized water, treated again with the mineral acid solution and once more rinsed with deionized water.

The solution of surfactant is passed through a suitable vessel, such as a column, containing the ion exchange resin, e.g. a solution of from about 1 to 40 weight percent in a suitable solvent. Such solutions may typically contain from 500 to 180,000 ppb each of sodium, iron and potassium ions. During the process of the resent invention, these levels are each reduced to as low as >10 ppb each.

The present invention provides a process for producing a developer having a very low level of metal ions and a process for producing semiconductor devices using such a developer for developing a photoresist. The developer is formulated by mixing a deionized surfactant solution and a metal ion free base, such as tetramethyl ammonium hydroxide.

The preferred solvent is deionized water. Other suitable solvents include ethanol and ethanol/water mixtures. The solvent may be present in the overall composition in an amount of up to about 95% by weight of the solids in the composition.

Any desired photoresist can be applied to a substrate by any conventional method used in the photoresist art, including dipping, spraying, whirling and spin coating. When spin coating, for example, the photoresist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds.

The photoresist composition is coated onto the substrate and the substrate is treated at a temperature from about 70° C. to about 120° C. for from about 30 seconds to about 180 seconds on a hot plate or for from about 15 to about 90 minutes in a convection oven. This temperature treatment is selected in order to reduce the concentration of residual solvents in the photoresist and antireflective coating, while not causing substantial thermal degradation of the photosensitizer. In general, one desires to minimize the concentration of solvents and this first temperature treatment is conducted until substantially all of the solvent has evaporated and a thin coating of photoresist composition, on the order of one micron in thickness, remains on the substrate. The treatment is conducted until the rate of change of solvent removal becomes relatively insignificant. The temperature and time selection depends on the photoresist properties desired by the user, as well as the equipment used and commercially desired coating times. The coating substrate can then be exposed to actinic radiation, e.g. ultraviolet radiation (at a wavelength of from about 300 nm to about 450 nm), x-ray, electron beam, ion beam or laser radiation, in any desired pattern, produced by use of suitable masks, negatives, stencils, templates, etc.

The substrate is then optionally subjected to a post exposure second taking or heat treatment either before or after development. The heating temperatures may range from about 90° C. to about 120° C. The heating may be conducted for from about 30 seconds to about 2 minutes, more preferably from about 60 seconds to about 90 seconds on a hot plate or about 30 to about 45 minutes by convection oven.

The exposed photoresist-coated substrates are developed by using an ion exchange resin treated developer to remove the image-wise exposed areas by immersion in a developing solution, or developed by a spray development process. The solution is preferably agitated, for example, by nitrogen burst agitation. The substrates are allowed to remain in the developer until all, or substantially all, of the photoresist coating has been dissolved from the exposed areas. Developers may include aqueous solutions of ammonium hydroxides. One especially preferred hydroxide is tetramethyl ammonium hydroxide.

After removal of the coated wafers from the developing solution, one may conduct an optional post-development heat treatment or bake to increase the coating's adhesion and chemical resistance to etching solutions and other substances. The post-development heat treatment can comprise the oven baking of the coating and substrate at a temperature below the coating's softening point. In industrial applications, particularly in the manufacture of microcircuitry units on silicon/silicon dioxide-type substrates, the developed substrates may be treated with a buffered, hydrofluoric acid base etching solution.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE 1

AMBERLYST 15 ion exchange resin beads were placed in a conical flask and deionized water was added so that all of the resin beads were under water. The flask were sealed and allowed to stand overnight to swell the resin beads. The next morning the water was decanted, deionized water was again added to cover the resin beads and the flask was shaken slowly. The water was again decanted. The rinsing with deionized water and decanting steps were repeated three more times. The resulting slurry of ion exchange resin was poured into a glass column equipped with a porous disk and a stopcock. The resin was allowed to settle to the bottom and the column was back flushed with deionized water for 25 minutes. The resin was again allowed to settle to the bottom. The bed volume was measured as 60 ml. A 10 percent sulfuric acid solution (6 bed volume) was passed down through the resin bed at a rate of about 16 ml. per minute (14.1 bed vol. per hour). Deionized water (60 bed vol.) was then allowed to pass down through the resin bed at about the same rate. The pH of the effluent water was measured to assure that it matched the pH of 6 for fresh deionized water.

Pluronic 25R8 surfactant (a fatty alcohol of an ethylene oxide/propylene oxide copolymer) solution (7% in deionized water) containing about 300 ppb of sodium, 160,000 ppb of potassium, and 50 ppb of iron, was passed down through the column at the same rate. The cleaned material obtained had less than 10 ppb each of sodium, potassium and iron.

TABLE 1

Metals in Ion Exchange Treated and Untreated Surfactant Solution:

| Sample # | Wt (g) | Na (ppb) | K (ppb) | Fe (ppb) |
|---|---|---|---|---|
| 1 untreated | — | 300 | 160,000 | 50 |
| 2 treated | 114 | <10 | <10 | <10 |
| 3 treated | 120 | <10 | <10 | <10 |
| 4 treated | 126 | <10 | <10 | <10 |
| 5 treated | 1400 | <10 | <10 | <12 |

EXAMPLE 2

A 10 percent (10%) electronic grade sulfuric acid solution (6 bde volumes) was passed through a canister containing Amberlyst-15 ion exchange resin, of bed volume 0.25 cu ft., at a rate of 14 bed voumes per hour. Deionized water [60 bed volumes) was then allowed to pass through the canister at the same rate. The pH of the effluent water was measured to assure that it matched the pH of 6 for fresh deionized water.

1500 gallons of a 10 weight percent solution of Pluronic 25R8 surfactant in deionized water was passed through the resin canister at the rate of 14 bed volume per hour. The treated solution had a metal ion content of less than 50 ppb each of sodium, potassium and iron.

EXAMPLE 3

Example 2 was repeated with 10 wt. % solution of surfactant Hodag (obtained from Calgene chemical) in deionized water was passed through the ion exchange resin canister. The treated solution had a metal ion content of less than 50 ppb each of sodium, potassium and iron.

EXAMPLE 4

Example 2 was repeated with 10 wt. % solution of surfactant Dowfax (obtained from Dow Chemcial) was passed through the ion exchange resin canister. The treated solution obtained had a metal ion content of less than 50 ppb of each of sodium, potassium and iron.

EXAMPLE 5

A surfactant solution (9% in DI water) was prepared as follows: 225 g Arkopal N060 surfactant nonylphenol-polyglycolether carboxylic acid

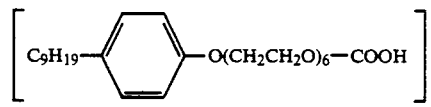

12.5 g Plurafac LF 700 surfactant alkoxy fatty alcohol, available from BASF, which is a fatty alcohol of a copolymer of ethylene oxide and propylene oxide, 112.5 g Marlophen DNP 30 surfactant dinonylphenol-polyethylene glycol ether dissolved in 4050 ml. of deionized water and 500 ml. of ethenol. 5 kg of this solution was passed through an ion exchange resin column of 550 ml. bed volume according to the procedure of Example 1. The treated solution was tested for metals and had a metal ion content as follows: sodium—less than 10 ppb, Iron —less than 10 ppb.

EXAMPLE 6

More untreated surfactant solution (5.0 Kg) identical to that ion exchange treated in Example 5 was passed through an ion exchange resin column of 550 ml. bed volume according to the procedure of Example 5. The treated solution was tested for eight different metals and had a metal ion content as follows:

| Sodium | - | 1.05 ppb | Copper | - | <6.0 ppb |
|---|---|---|---|---|---|
| Potassium | - | <1.0 ppb | Aluminum | - | <6.0 ppb |
| Iron | - | 6.0 ppb | Magnesium | - | <0.5 ppb |
| Calcium | - | <2.5 ppb | Nickel | - | <25 ppb |

EXAMPLE 7

100 g of the surfactant solution of Example 3 was mixed with 10 g of surfactant solution of Example 4. To it 85.92 g of tetramethylammonium hydroxide was added. This mixture was diluted with 804.08 g of DI water to provide 0.24 N developer solution. The resulting developer solution had a metal ion content of less than 20 ppb of each of sodium, potassium and iron.

What is claimed:

1. A process for producing a developer containing a surfactant, having a very low level of metal ions, which comprises:
   a) treating an acidic ion exchange resin with water, followed by a mineral acid solution to reduce the level of sodium and iron ions in the ion exchange resin to less than 500 ppb each;
   b) providing a solution of 1 to 40 weight percent of a surfactant in a deionized solvent;
   c) passing the surfactant solution through the ion exchange resin and reducing the level of total sodium and iron ions in the solution to less than 200 ppb each;
   d) formulating a developer composition containing a surfactant by providing an admixture of:
      (1) the ion exchange resin treated surfactant solution in a suitable deionized solvent;
      (2) a suitable metal ion free developer.

2. The process of claim 1 wherein, prior to the ion exchange resin is treated with a solvent which is the same as, or at least compatible with, the solvent for the component or mixture of components which is to be treated with the ion exchange resin.

3. The process of claim 2 wherein the ion exchange resin is treated with sufficient new solvent to substantially remove other solvents and to saturate the ion exchange resin with the new solvent.

4. The process of claim 1 wherein the deionized solvent is selected from the group consisting of water, ethanol and a water/ethanol mixture.

5. The process of claim 1 wherein the developer is an ammonium hydroxide.

6. The process of claim 5 wherein the developer is tetramethyl ammonium hydroxide.

7. A process for producing a semiconductor device by producing a photoimage on a suitable substrate comprising:
   a) treating an acidic ion exchange resin with water, followed by a mineral acid solution to reduce the level of sodium and iron ions in the ion exchange resin to less than 500 ppb each;
   b) providing a solution of 1 to 40 weight percent of a surfactant in a deionized solvent;
   c) passing the surfactant solution through the ion exchange resin and reducing the level of total sodium and iron ions in the solution to less than 200 ppb each;
   d) formulating a developer composition containing a surfactant by providing an admixture of:
      (1) the ion exchange resin treated surfactant solution in a suitable deionized solvent;
      (2) a suitable metal ion free developer;
   e) providing an admixture of: 1) a photosensitive component in an amount sufficient to photosensitize the photoresist composition, 2) a water insoluble, aqueous alkali soluble novolak resin and 3) a suitable solvent;
   f) coating a suitable substrate with the photoresist composition;
   g) heat treating the coated substrate until substantially all of the solvent is removed;
   h) image-wise exposing the photoresist composition; and
   i) removing the image-wise exposed areas of the photoresist composition with said developer.

8. The process of claim 7 wherein the developer is an ammonium hydroxide.

9. The process of claim 8 wherein the developer is tetramethyl ammonium hydroxide.

* * * * *